United States Patent
Miya et al.

(10) Patent No.: US 6,677,102 B2
(45) Date of Patent: Jan. 13, 2004

(54) CHEMICAL AMPLIFYING TYPE POSITIVE RESIST COMPOSITION

(75) Inventors: Yoshiko Miya, Kyoto (JP); Yasunori Uetani, Toyonaka (JP); Hiroaki Fujishima, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 101 days.

(21) Appl. No.: 10/093,399

(22) Filed: Mar. 11, 2002

(65) Prior Publication Data
US 2002/0168583 A1 Nov. 14, 2002

(30) Foreign Application Priority Data
Mar. 15, 2001 (JP) ......................... 2001-073810

(51) Int. Cl.[7] ............. G03F 7/004; G03F 7/39
(52) U.S. Cl. .......... 430/270.1; 430/905; 526/270; 526/272
(58) Field of Search ............... 430/270.1, 905, 430/910; 526/270, 272

(56) References Cited

U.S. PATENT DOCUMENTS

| | | | | |
|---|---|---|---|---|
| 5,496,958 A | * | 3/1996 | Fischer et al. | 548/552 |
| 6,239,231 B1 | * | 5/2001 | Fujishima et al. | 525/337 |
| 6,291,130 B1 | * | 9/2001 | Kodama et al. | 430/270.1 |
| 6,383,713 B1 | * | 5/2002 | Uetani et al. | 430/270.1 |
| 2001/0026901 A1 | | 10/2001 | Maeda et al. | |
| 2002/0009667 A1 | * | 1/2002 | Nishimura et al. | 430/270.1 |
| 2002/0061463 A1 | * | 5/2002 | Nishi et al. | 430/270.1 |
| 2002/0155379 A1 | * | 10/2002 | Yoon et al. | 430/270.1 |
| 2003/0008232 A1 | * | 1/2003 | Kinsho et al. | 430/270.1 |

FOREIGN PATENT DOCUMENTS

| | | |
|---|---|---|
| JP | 11-222460 A | 8/1999 |
| JP | 2000-26446 A | 1/2000 |

OTHER PUBLICATIONS

Hofer et al., J. Potopolymer Sci. and Tech., vol. 9, No. 3 (1996) pp. 387–398.
Wallow et al., SPIE, vol. 2724 (1996) pp. 355–364.

* cited by examiner

*Primary Examiner*—Janet Baxter
*Assistant Examiner*—Yvette C. Thornton
(74) *Attorney, Agent, or Firm*—Birch, Stewart, Kolasch & Birch, LLP

(57) ABSTRACT

A chemical amplifying type positive resist composition, excellent in balance of performance of resolution and sensitivity, having high dry etching resistance and comprising;
a resin having a polymerization unit derived from a monomer represented by the following formula (I):

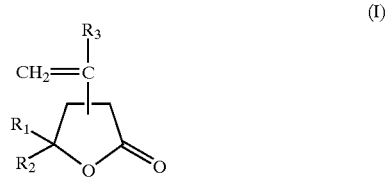

wherein $R_1$ and $R_2$ independently represent hydrogen or an alkyl group having 1 to 4 carbons, and $R_3$ represents hydrogen or a methyl group,
the resin being insoluble in alkali itself but becoming alkali-soluble due to the action of an acid; and an acid generating agent is provided.

9 Claims, No Drawings

CHEMICAL AMPLIFYING TYPE POSITIVE RESIST COMPOSITION

BACKGROUND OF THE INVENTION

The present invention relates to a chemical amplifying type positive resist composition used in the minute processing of a semiconductor.

A lithography process using a resist composition has usually been adopted in the minute processing of a semiconductor. In the lithography, the resolution can be improved with a decrease in wavelength of exposure light in principle as expressed by the equation of Rayleigh's diffraction limit. A g-line with a wavelength of 436 nm, an i-line with a wavelength of 365 nm, and a KrF excimer laser with a wavelength of 248 nm have been adopted as exposure light sources for lithography used in the manufacture of a semiconductor. Thus, the wavelength has become shorter year by year. An ArF excimer laser having a wavelength of 193 nm is considered to be promising as a next-generation exposure light source.

A lens used in an ArF excimer laser exposure machine has a shorter lifetime as compared with lenses for conventional exposure light sources. Accordingly, the shorter time required for exposure to ArF excimer laser light is desirable. For this reason, it is necessary to enhance the sensitivity of a resist. Consequently, there has been used a so-called chemical amplifying type resist, which utilizes the catalytic action of an acid generated by exposure and contains a resin having a group cleavable by the acid.

It is known that, desirably, resins used in a resist for ArF excimer laser exposure have no aromatic ring in order to ensure the transmittance of the resist, but have an alicyclic ring in place of an aromatic ring in order to impart a dry etching resistance thereto. Various kinds of resins such as those described in Journal of Photopolymer Science and Technology, Vol. 9, No. 3, pages 387–398 (1996) by D. C. Hofer, are heretofore known as such resins.

As a resin used in a resist for ArF excimer laser exposure, a mutual copolymer composed of a polymerization unit of alicyclic olefin and a polymerization unit of an unsaturated dicarboxylic acid anhydride (T. I. Wallow et al., Proc. SPIE, vol. 2724, pp. 355–364 (1996)), a polymer having an alicycliclactone structure unit (JP-A-2000-26446) and the like are known. However, any of such resins finds difficulty in providing dry etching resistance as high as that of an aromatic ring.

An object of the present invention is to provide a chemical amplifying type positive resist composition comprising a resin and an acid generating agent suitable for lithography using excimer laser light such as ArF and KrF, which is excellent in balance of performance of resolution and sensitivity and has high dry etching resistance.

The present inventors have found that a resist composition excellent in balance of performance such as resolution, profile, sensitivity and adhesion and high in dry etching resistance is obtainable by using a resin having a polymerization unit derived from a monomer having a specific structure, as a part of the polymerization units of a resin constituting a chemical amplifying type positive resist composition. The present invention has been completed based on this finding.

SUMMARY OF THE INVENTION

The present invention provides a chemical amplifying type positive resist composition comprising;

a resin having a polymerization unit derived from a monomer represented by the following formula (I):

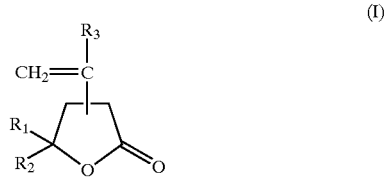

wherein $R_1$ and $R_2$ independently represent hydrogen or an alkyl group having 1 to 4 carbons, and $R_3$ represents hydrogen or a methyl group;

the resin being insoluble in alkali itself but becoming alkali-soluble die to the action of an acid; and an acid generating agent.

DESCRIPTION OF EMBODIMENTS

The resist composition of the present invention comprises a resin having a polymerization unit derived from a monomer represented by the formula (I) above as a resin component. Specific examples of the monomer represented by formula (I) include the following compounds with the one on the left being preferable.

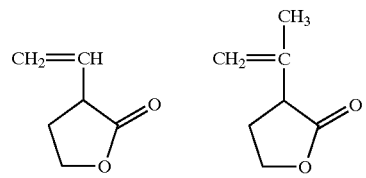

The resin as a component of the positive resist composition of the present invention is insoluble in alkali but becomes soluble due to the action of an acid. The resin preferably contains a polymerization unit having a group deblocked due to the action of an acid.

Specific examples of the group deblocked due to the action of an acid include various types of carboxylic acid esters, including: alkyl esters having about 1 to 6 carbons typified by tert-butyl ester; acetal esters such as methoxymethyl ester, ethoxymethyl ester, 1-ethoxyethyl ester, 1-isobutoxyethyl ester, 1-isopropoxyethyl ester, 1-ethoxypropyl ester, 1-(2-methoxyethoxy)ethyl ester, 1-(2-acetoxyethoxy)ethyl ester, 1-[2-(1-adamantyloxy)ethoxy] ethyl ester, 1-[2-(1-adamantanecarbonyloxy)ethoxy]ethyl ester, tetrahydro-2-furyl ester and tetrahydro-2-pyranyl ester; and alicyclic esters such as 2-alkyl-2-adamantyl, 1-(1-adamantyl)-1-alkylalkyl and isobornyl ester.

The monomer from which the polymerization unit having a carboxylic acid ester described above is derived may be an acrylic one such as methacrylic acid ester and acrylic acid ester, or an alicyclic monomer with a carboxylic ester group bound thereto, such as norbornene carboxylic acid ester, tricyclodecene carboxylic acid ester and tetracyclodecene carboxylic acid ester. Otherwise, it may be an ester formed by an alicyclic group of an alicyclic carboxylic acid ester and an acrylic acid or a methacrylic acid, as described in Iwasa et al., Journal of Photopolymer Science and Technology, Vol. 9, No. 3, pp. 447–456 (1996).

Among the monomers described above, one having a bulky group containing an alicyclic group such as 2-alkyl-2-adamantyl and 1-(1-adamantyl)-1-alkylalkyl, as the group deblocked due to the action of an acid, is preferably used because such a monomer exhibits excellent resolution. Examples of the monomer having a bulky group containing an alicyclic group include (meta)acrylic acid 2-alkyl-2-adamantyl, (meta)acrylic acid 1-(1-adamantyl)-1-alkylalkyl, 5-norbornene-2-carboxylic acid 2-alkyl-2-adamantyl and 5-norbornene-2-carboxylic acid 1-(1-adamantyl)-1-alkylalkyl.

Among others, use of (meta)acrylic acid 2-alkyl-2-adamantyl as the monomer is preferred for its excellent resolution. Typical examples of the (meta)acrylic acid 2-alkyl-2-adamantyl include acrylic acid 2-methyl-2-adamantyl, methacrylic acid 2-methyl-2-adamantyl, acrylic acid 2-ethyl-2-adamantyl, methacrylic acid 2-ethyl-2-adamantyl and acrylic acid 2-n butyl-2-adamantyl. Among others, acrylic acid 2-methyl-2-adamantyl and methacrylic acid 2-methyl-2-adamantyl are preferred.

Another monomer having a group deblocked due to the action of an acid may also be used as required.

The resin according to the present invention may also have a polymerization unit derived from a monomer having no group deblocked due to the action of an acid. Examples of such a monomer include (meta)acrylic acid esters, alicyclic olefins, unsaturated dicarboxylic acid anhydrides and (meta)acrylonitrile. Specifically, the following compounds are included:

3-hydroxy-1-adamantyl acrylate;
3-hydroxy-1-adamantyl methacrylate;
3,5-dihydroxy-1-adamantyl methacrylate;
α-acryloyloxy-γ-butyrolactone;
α-methacryloyloxy-γ-butyrolactone;
β-acryloyloxy-γ-butyrolactone;
β-methacryloyloxy-γ-butyrolactone;
5-acryloyloxy-2,6-norbornane carbolactone;
5-methacryloyloxy-2,6-norbornane carbolactone;
2-norbornen;
2-hydroxy-5-norbornen;
5-norbornen-2-carboxylate;
methyl 5-norbornen-2-carboxylate;
5-norbornen-2-carboxylate-t-butyl
1-cyclohexyl-1-methylethyl 5-norbornen-2-carboxylate;
1-(4-methylcyclohexyl)-1-methylethyl 5-norbornen-2-carboxylate;
1-(4-hydroxycyclohexyl)-1-methylethyl 5-norbornen-2-carboxylate;
1-methyl-1-(4-oxocyclohexyl)ethyl 5-norbornen-2-carboxylate;
1-(1-adamantyl)-1-methylethyl 5-norbornen-2-carboxylate;
1-methylcyclohexyl 5-norbornen-2-carboxylate;
2-methyl-2-adamantyl 5-norbornen-2-carboxylate;
2-ethyl-2-adamantyl 5-norbornen-2-carboxylate;
2-hydroxy-1-ethyl 5-norbornen-2-carboxylate;
5-norbornen-2-methanol;
5-norbornen-2,3-dicarboxylic acid anhydride; etc.;
maleic anhydride; and
itaconic anhydride.

A resin used in the present invention varies depending on the type of rays used in the exposure for patterning, the types of other polymerization units contained as required, etc., but it is preferably obtained by polymerizing 5 to 50 mol % of a monomer expressed by the formula (1) with any other monomers as required.

The copolymerization can be carried out by a normal method. For example, a copolymer resin specified in the present invention can be obtained by dissolving the required monomers in an organic solvent and polymerizing the same in the presence of a polymerization initiator like an azo compound such as 2,2'-azo-bisisobutyronitrile or dimethyl 2,2'azobis(2-methylpropionate). After the reaction, it is advantageous to purify the same by reprecipitation.

The acid generating agent, another component of the resist composition, is a substance which is decomposed to generate an acid by applying a radiation such as a light, an electron beam or the like on the substance itself or on a resist composition containing the substance. The acid generated from the acid generating agent acts on said resin resulting in cleavage of the group cleavable by the action of an acid existing in the resin.

Such acid generating agents, for example, include other onium salt compounds, organno-halogen compound, sulfone compounds, sulfonate compounds, and the like.

Specific examples thereof include:
diphenyliodonium trifluoromethanesulfonate,
4-methoxyphenylphenyliodonium hexafluoroantimonate,
4-mthoxyphenylphenyliodonium trifluoromethanesulfonate,
bis(4-tert-butylphenyl)iodonium tetrafluoroborate,
bis(4-tert-butylphenyl)iodonium hexafluorophosphate,
bis(4-tert-butylphenyl)iodonium hexafluoroantimonate,
bis(4-tert-butylphenyl)iodonium trifluoromethanesulfonate,
bis(4-tert-butylphenyl)iodonium camphorsulfonate,
triphenyisulfonium hexafluorophosphate,
triphenylsulfonium hexafluoroantimonate,
triphenylsulfonium trifluoromethanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
p-tolyldiphenylsulfonium perfluorobutanesulfonate,
p-tolyldiphenylsulfonium perfluorooctanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphthoylmethyl)thiolanium hexafluoroantimonate,
1-(2-naphthoylmethyl)thiolanium trifluoromethanesulfonate,
4-hydroxy-1-naphthyldimethylsulfonium hexafluoroantimonate,
4-hydroxy-1-naphthyldimethylsulfonium trifluoromethanesulfonate,
cyclohexylmethyl(2-oxocyclohexyl)sulfonium trifluoromethanesulfonate,
cyclohexylmethyl(2-oxocyclohexyl)sulfonium perfluorobutanesulfonate, cyclohexylmethyl(2-oxocyclohexyl)sulfonium
  perfluorooctanesulfonate,
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-
  triazine,
2-(4-methoxyphenyl)-4,6-bis(trichloromethyl)-1,3,5-
  triazine,
2-(4-methoxy-1-naphthyl)-4,6-bis(trichloromethyl)-1,3,
  5-triazine,
2-(benzo[d][1,3]dioxolane-5-yl)-4,6-bis
  (trichloromethyl)-1,3,5-triazine,
2-(4-methoxystyryl)-4,6-bis(trichloromethyl)-1,3,5-
  triazine,
2-(3,4,5-trimethoxystyryl)-4,6-bis(trichloromethyl)-1,3,
  5-triazine,
2-(3,4-dimethoxystyryl)-4,6-bis(trichloromethyl)-1,3,5-
  triazine,
2-(2,4-dimethoxystyryl)-4,6-bis(trichloromethyl)-1,3,5-
  triazine,
2-(2-methoxystyryl)-4,6-bis(trichloromethyl)-1,3,5-
  triazine,
2-(4-butoxystyryl)-4,6-bis(trichloromethyl)-1,3,5-
  triazine,
2-(4-pentyloxystyryl)-4,6-bis(trichloromethyl)-1,3,5-
  triazine,
diphenyl disulfone,
di-p-tolyl disulfone,
bis(phenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane,
1-benzoyl-1-phenylmethyl p-toluenesulfonate (so-called
  benzointosylate),
2-benzoyl-2-hydroxy-2-phenylethyl p-toluenesulfonate
  (so-called α-methylolbenzointosylate),
1,2,3-benzenetriyl trimethanesulfonate,
2,6-dinitrobenzyl p-toluenesulfonate,
2-nitrobenzyl p-toluenesulfonate,
4-nitrobenzyl p-toluenesulfonate,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-
  dicarboxyimide,
N-(trifluoromethylsulfonyloxy)naphthalimide,
N-(10-camphorsulfonyloxy)naphthalimide, and the like.

It is also known that, generally in a chemical amplifying type positive resist composition, performance deterioration due to the deactivation of an acid associated with leaving after exposure can be reduced by adding basic compounds, especially basic nitrogen-containing organic compounds such as amines as quenchers. It is also preferable in the present invention that such basic compounds are added. Concrete examples of the basic compounds to be used as quenchers include the ones represented by the following formulae:

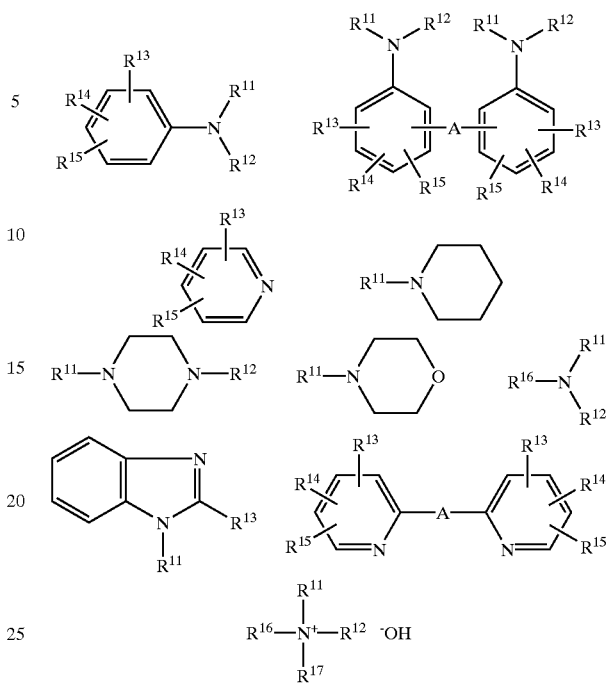

wherein $R^{11}$, $R^{12}$ and $R^{17}$ represent, independently each other, hydrogen, cycloalkyl, aryl or alkyl which may be optionally substituted with a hydroxyl, amino which may be optionally substituted with alkyl having 1 to 6 carbon atoms, or alkoxy having 1 to 6 carbon atoms; $R^{13}$, $R^{14}$ and $R^{15}$, which are same or different from each other, represent hydrogen, cycloalkyl, aryl, alkoxy or alkyl which may be optionally substituted with a hydroxyl, amino which may be optionally substituted with alkyl having 1 to 6 carbon atoms, or alkoxy having 1 to 6 carbon atoms; $R^{16}$ represents cycloalkyl or alkyl which may be optionally substituted with a hydroxyl, amino which may be optionally substituted with alkyl having 1 to 6 carbon atoms, or alkoxy having 1 to 6 carbon atoms; A represents alkylene, carbonyl, imino, sulfide or disulfide. The alkyl represented by $R^{11}$ to $R^{17}$ and alkoxy represented by $R^{13}$ to $R^{15}$ may have about 1 to 6 carbon atoms. The cycloalkyl represented by $R^{11}$ to $R^{17}$ may have about 5 to 10 carbon atoms and the aryl represented by $R^{11}$ to $R^{15}$ and $R^{17}$ may have about 6 to 10 carbon atoms. The alkylene represented by A may have about 1 to 6 carbon atoms and may be straight-chained or branched.

The resist composition of the present invention preferably contains the resin in an amount of 80 to 99.9% by weight, and the acid generating agent in an amount of 0.1 to 20% by weight based on the total weight of the resin and the acid generating agent. When a basic compound is used as a quencher, it is preferably contained in an amount in the range of 0.001 to 1 part by weight, more preferably 0.01 to 0.3 part by weight per 100 parts by weight of the resin. The composition may also contain, if required, a small amount of various additives such as sensitizers, dissolution inhibitors, resins other than the above resin, surfactants, stabilizers, and dyes so far as the objects of the present invention is not harmed.

The resist composition of the present invention generally becomes a resist solution in the state in which the above-described components are dissolved in a solvent to be applied on a substrate such as a silicon wafer. The solvent herein used may be one which dissolves each component, has an appropriate drying rate, and provides a uniform and smooth coating after evaporation of the solvent, and can be one which is generally used in this field.

Examples thereof include glycol ether esters such as ethylcellosolve acetate, methylcellosolve acetate, and propylene glycol monomethyl ether acetate; esters such as ethyl lactate, butyl acetate, amyl acetate, and ethyl pyruvate; ketones such as acetone, methyl isobutyl ketone, 2-heptanone, and cyclohexanone; and cyclic esters such as γ-butyrolactone. These solvents can be used alone or in combination of two or more thereof.

The resist film applied on a substrate, and dried is subjected to an exposure treatment for patterning. Then, after a heat-treatment for promoting a protecting deblocking reaction, development by an alkali developer is conducted. The alkali developer herein used can be various kinds of alkaline aqueous solutions used in this field. In general, an aqueous solution of tetramethylammoniumhydroxide or (2-hydroxyethyl)trimethylammoniumhydroxide (so-called) colline) is often used.

The present invention will be described in more detail by way of examples, which should not be construed as limiting the scope of the present invention. All parts in examples are by weight unless otherwise stated. The weight-average molecular weight is a value determined from gel permeation chromatography using polystyrene as a reference standard.

RESIN SYNTHESIS EXAMPLE 1 (SYNTHESIS Of RESIN A1)

2-methyl-2-adamantyl-methacrylate, 3-hydroxy-1-adamantyl methacrylate and 3-vinyl-γ-butyrolactone were mixed at a ratio of 2:1:1 (20.0 g : 10.1 g : 4.8 g), and methyl isobutyl ketone, equivalent to 2 times all the monomers by weight, was added thereto so as to obtain a solution. Furthermore, azo-bisisobutyronitrile, equivalent to 3 mol % of all the monomers, was added thereto as an initiator. Thereafter, it was heated to 80° C., and was stirred for 15 hours. After the reaction mass was cooled, an operation of precipitation with a massive amount of methanol was carried out three times for purification, and a copolymer having an weight average molecular weight of approximately 8000 was obtained. This copolymer is hereinafter referred to as resin A1.

RESIN SYNTHESIS EXAMPLE 2 (SYNTHESIS Of RESIN AX)

2-methyl- 2-adamantyl-methacrylate, 3-hyduroxy-1-adamantyl methacrylate, and α-methacryloyloxy-γ-butyrolactone were mixed at a ratio of 5:2.5:2.5 (20.0 g: 10.1 g: 7.8 g), and methyl isobutyl ketone, equivalent to 2 times all the monomers by weight, was added thereto so as to obtain a solution. Furthermore, azobis isobutyronitrile, equivalent to 2 mol % of all the monomers, was added thereto as an initiator. Thereafter, it was heated to 85° C. for about 8 hours. Then, an operation of precipitation with a massive amount of heptane was carried out three times for purification, and a copolymer having an weight average molecular weight of approximately 14500 was obtained. This copolymer is hereinafter referred to as resin AX.

Next, resist compositions were prepared using acid generating agents and quenchers shown below in addition to the respective resins obtained in the foregoing resin synthesis examples. The results of evaluation of the same are shown below.

EXAMPLE 1 AND COMPARATIVE EXAMPLE 1

The following components were mixed and dissolved, and filtered through a fluorine resin filter having a pore diameter of 0.2 μm to prepare a resist solution.

| | |
|---|---|
| Resin (as to type, see Table 1) | 10 parts |
| Acid generating agent: p-tolyldiphenyl sulfonium perfluorooctane sulfonate | 0.2 part |
| Quencher: 2,6-diisopropile aniline | 0.0075 parts |
| Solvent: | |
| Propylene glycol monomethyl ether acetate | 57 parts |
| γ-butyrolactone | 3 parts |

An organic anti-reflective coating composition, ARC-25-8, manufactured by Brewer was coated on a silicon wafer and was baked at 215° C. for 60 seconds, so that a 780 Å-thick organic anti-reflective coating was formed. The resist solution prepared as described above was applied thereon by spin coating so as to have a thickness after drying of 0.39 μm. After the application of the resist, it was pre-baked at 130° C. for 60 seconds on a direct hot plate. The wafer on which a resist film was thus provide was exposed to radiation using an ArF eximer stepper ("NSR ArF" manufactured by NICON, NA=0.55, σ=0.6), so that a line-and-space pattern was formed by varying an exposure amount stepwise.

After the exposure, it was subjected to post-exposure baking on a hot plate at 130° C. for 60 seconds, and further, subjected to paddle development for 60 seconds by using 2.38 wt % aqueous solution of tetramethylammonium hydroxide.

The line-and-space pattern on the organic anti-reflective film substrate after the development was observed with a scanning-type electron microscope, and effective sensitivity and resolution were measured by the following method. The results are shown in Table 1.

Effective sensitivity: expressed by exposure amount causing line-and-space pattern of 0.18 μm to be 1:1

Resolution: expressed by a minimum size of a line-and-space pattern resolved with the light exposure of the effective sensitivity.

[Measurement of Dry Etching Resistance]

A silicon wafer subjected to hexamethyldisilazane treatment was spin-coated with a resist solution prepared above to give a thickness after drying of 0.5 μm. The wafer coated with the resist solution was pre-baked on a direct hot plate under conditions of 130° C. for 60 seconds, then, subjected to post exposure baking without exposure on the hot plate under conditions of 130° C. for 60 seconds, and subsequently subjected to paddle development with an aqueous solution of 2.38 wt. % tetramethyl ammonium hydroxide for 60 seconds.

After the development, the wafer was etched with DEM-451 (manufactured by ANELVA Corp.) using a mixed gas of 2.5 sccm of oxygen and 50 sccm of CHF$_3$ at a degree of vacuum of 16 Pa and incidence power of 250 W for four minutes. The difference in film thickness between before and after etching was represented as a ratio with respect to that obtained using a novolac resin (resist for I-line). A smaller value indicates a higher dry etching resistance. The film thickness was measured with Lambda Ace (Dainippon Screen Mfg. Co., Ltd.).

TABLE 1

| No. | Resin | Effective Sensitivity (mJ/cm$^2$) | Resolution ($\mu$m) | dry etching resistance |
|---|---|---|---|---|
| Example 1 | A1 | 74 | 0.14 | 1.1 |
| Comparative Example 1 | AX | 43 | 0.14 | 1.4 |

As is apparent from Table 1, the resist of Example 1 is excellent in balance of performance and has high dry etching resistance.

The chemical amplifying type positive resist composition of the present invention is excellent in balance of performance of resolution and sensitivity and has high dry etching resistance. Therefore, the composition can exhibit excellent performance as a resist for KrF and ArF excimer lasers.

What is claimed is:

1. A chemical amplifying type positive resist composition comprising;
   a resin having a polymerization unit derived from a monomer represented by the following formula (I):

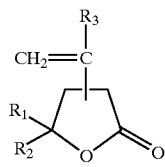

(I)

wherein $R_1$ and $R_2$ independently represent hydrogen or an alkyl group having 1 to 4 carbons, and $R_3$ represents hydrogen or a methyl group,
   the resin being insoluble in alkali itself but becoming alkali-soluble due to the action of an acid; and
   an acid generating agent.

2. The chemical amplifying type positive resist composition according to claim 1, which comprises the resin in an amount of 80 to 99.9% by weight, and the acid generating agent in an amount of 0.1 to 20% by weight based on the total weight of the resin and the acid generating agent.

3. The chemical amplifying type positive resist composition according to claim 1, wherein molar ratio of the polymerization unit derived from the monomer expressed by the formula (1) is 5 to 50% in the whole polymerization units.

4. The chemical amplifying type positive resist composition according to claim 1, wherein the resin contains a polymerization unit having a group deblocked due to the action of an acid.

5. The chemical amplifying type positive resist composition according to claim 4, wherein the group deblocked due to the action of an acid is acrylic acid 2-alkyl-2-adamantyl or metaacrylic acid 2-alkyl-2-adamantyl.

6. The chemical amplifying type positive resist composition according to claim 5, wherein acrylic acid 2-alkyl-2-adamantyl or metaacrylic acid 2-alkyl-2-adamantyl is acrylic acid 2-methyl-2-adamantyl or metaacrylic acid 2-methyl-2-adamantyl.

7. The chemical amplifying type positive resist composition according to claim 1, which further comprises a basic compound as quencher.

8. The chemical amplifying type positive resist composition according to claim 7, wherein the basic compound is contained in an amount in the range of 0.001 to 1 part by weight per 100 parts by weight of the resin.

9. The chemical amplifying type positive resist composition according to claim 1, wherein a monomer represented by the formula (I) is represented by the following formula (II):

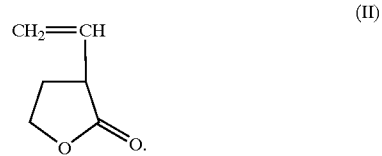

(II)

* * * * *